United States Patent [19]

Shikakura et al.

[11] Patent Number: 5,303,245
[45] Date of Patent: Apr. 12, 1994

[54] INFORMATION SIGNAL PROCESSING METHOD AND APPARATUS

[75] Inventors: Akihiro Shikakura, Kawasaki; Shinichi Yamashita, Yokohama, both of Japan

[73] Assignee: Canon Kabushiki Kaisha, Tokyo, Japan

[21] Appl. No.: 666,608

[22] Filed: Mar. 8, 1991

[30] Foreign Application Priority Data

Mar. 20, 1990 [JP] Japan .................................. 2-072931

[51] Int. Cl.$^5$ ...................... H03M 13/00; G06F 11/10
[52] U.S. Cl. ................... 371/37.1; 371/37.4; 371/38.1
[58] Field of Search .............. 371/37.1, 38.1, 39.1, 371/2.1, 2.2, 37.4, 37.5, 40.1; 360/48, 49, 53

[56] References Cited

U.S. PATENT DOCUMENTS

| | | | |
|---|---|---|---|
| 3,893,078 | 7/1975 | Finet | 371/37.1 |
| 4,346,473 | 8/1982 | Davis | 371/37.1 X |
| 4,592,054 | 5/1986 | Namekawa | 371/38.1 |
| 4,604,657 | 8/1986 | Fukami et al. | 360/32 |
| 4,638,478 | 1/1987 | Hatabe | 370/94 |
| 4,747,104 | 5/1988 | Piret | 371/38.1 |
| 4,763,331 | 8/1988 | Matsumoto | 371/37 |
| 4,791,643 | 12/1988 | Molstad et al. | 371/40 |
| 4,794,602 | 12/1988 | Tanaka | 371/38.1 X |
| 4,856,003 | 8/1989 | Weng | 371/37.1 |
| 5,111,462 | 5/1992 | Tarrant | 371/37.1 |
| 5,164,944 | 11/1992 | Benton | 371/2.2 X |

FOREIGN PATENT DOCUMENTS

| | | |
|---|---|---|
| 0176218 | 8/1985 | European Pat. Off. . |
| WOA186036-34 | 6/1986 | European Pat. Off. . |
| 0229698 | 1/1987 | European Pat. Off. . |
| 0306020 | 9/1988 | European Pat. Off. . |
| 8600185 | 1/1986 | PCT Int'l Appl. ................ 371/37.1 |

OTHER PUBLICATIONS

Stanton et al., IBM Technical Disclosure Bulletin vol. 10, No. 7 Dec. 1967, pp. 934–937.

*Primary Examiner*—Charles E. Atkinson
*Assistant Examiner*—Glenn Snyder
*Attorney, Agent, or Firm*—Fitzpatrick, Cella, Harper & Scinto

[57] ABSTRACT

In an information signal processing arrangement, an information signal, to which an error detecting code has been added and a part of which other than the error detecting code has been set to a code indicating a predetermined value, is received. Error detection capability is increased by detecting an error in the information signal according to the error detecting code added to the received information signal, and detecting whether or not the part of the information signal set to the predetermined value has changed.

28 Claims, 3 Drawing Sheets

INFORMATION SIGNAL PROCESSING METHOD AND APPARATUS

BACKGROUND OF THE INVENTION

1. Field of the Invention

This invention relates to an information signal processing method and apparatus, and more particularly, to an information signal processing method and apparatus which detects an error in an information signal.

2. Description of the Prior Art

An error detection method using CRCC (cyclic redundancy check code) has been known as a method to detect an error in information data which is generated on a transmission channel in transmission or recording/reproduction of an information signal, particularly digital information data.

The principle of the error detection for information data using the CRCC comprises dividing the information data by a predetermined formula to generate a polynominal and using the remainder of the division as check data.

That is, when the transmitted information data to which the CRCC has been added are divided at the reception side, the data are divisible with a remainder "0" if no error is generated in the information data on the transmission channel, and the data are not divisible with a remainder of "0" if an error is generated in the information data on the transmission channel. Hence, by using the remainder, it is possible to detect an error in the information data which has been generated on the transmission channel.

As for the data error detection capability of the CRCC, when check data of m (m is a positive integer) bits have been added, the generation of a burst error of m bits or less can be detected with a probability of 100%, and the generation of a burst error of (m+1) bits or more cannot be detected with a probability of about $\frac{1}{2} \times m$.

That is, if it is assumed that a data error of any pattern is generated with the same probability, the probability that the detection of a data error becomes impossible can be considered to be about $\frac{1}{2} \times m$ in total.

As described above, in data error detection using only the CRCC, the detection of a data error is not always possible with a predetermined probability.

Particularly, when check data comprise m bits as described above, it is impossible to detect whether or not an error is generated in data for about $\frac{1}{2} \times m$ of the data if a burst error having a bit length longer than m bits has been generated, causing a misoperation in an apparatus at the reception side when the information data are identification information (ID) data or the like.

SUMMARY OF THE INVENTION

It is an object of the present invention to provide an information signal processing method and apparatus which can solve the above-described problems.

It is another object of the present invention to provide an information signal processing method which has a high detection capability for an error in an information signal.

These objects are accomplished, according to one aspect of the present invention, by receiving an information signal to which an error detecting code has been added, and a part of which other than the error detecting code has been set to a code indicating a predetermined value, detecting an error in the information signal according to the error detecting code added to the received information signal, and detecting an error in the information signal by detecting whether or not the part of the information signal set to the predetermined value has changed.

It is still another object of the present invention to provide an information signal processing apparatus which has a high detection capability for an error in an information signal.

This object is accomplished, according to another aspect of the present invention, by an information signal processing apparatus comprising reception means for receiving an information signal to which an error detecting code has been added and a part of which other than the error correcting code has been set to a code indicating a predetermined value, first error detection means for detecting an error in the information signal according to the error detecting code added to the information signal received by the reception means, and second error detection means for detecting an error in the information signal by detecting whether or not the part of the information signal set to the predetermined value has changed.

The foregoing and other objects and features of the present invention will become more apparent from the following detailed description of the preferred embodiments taken in connection with the accompanying drawings.

DETAILED DESCRIPTION OF THE PREFERRED EMBODIMENTS

Embodiments of the present invention will now be explained in detail.

In the transmission of a digital information signal, information data corresponding to information and check data used as a CRCC are usually processed in units of 4 bits or 8 bits, and an information data length and a check data length are also set to the number of bits equal to a multiple of 4 or 8.

However, the number of bits of data actually used as information data or check data is in most cases shorter than the set number of bits. In such cases, data which are not used as information data or check data are set to fixed data having a predetermined data pattern.

Even within data which are actually used as information data or check data, data which can be considered pseudo-fixed data because an invariable data pattern is maintained for a long period, may be present in some cases.

For example, significant-bit data in address data constituting data representing address information have a longer period for the change of its data pattern than lower-bit data, and therefore can be considered as pseudo-fixed data with respect to the lower-bit data.

Hence, in an information signal processing apparatus shown in the present embodiments, by paying attention to the above-described unused data and pseudo-fixed data, and utilizing these data for error detection in data, the data error detection capability of the apparatus can be increased.

Figure 1:
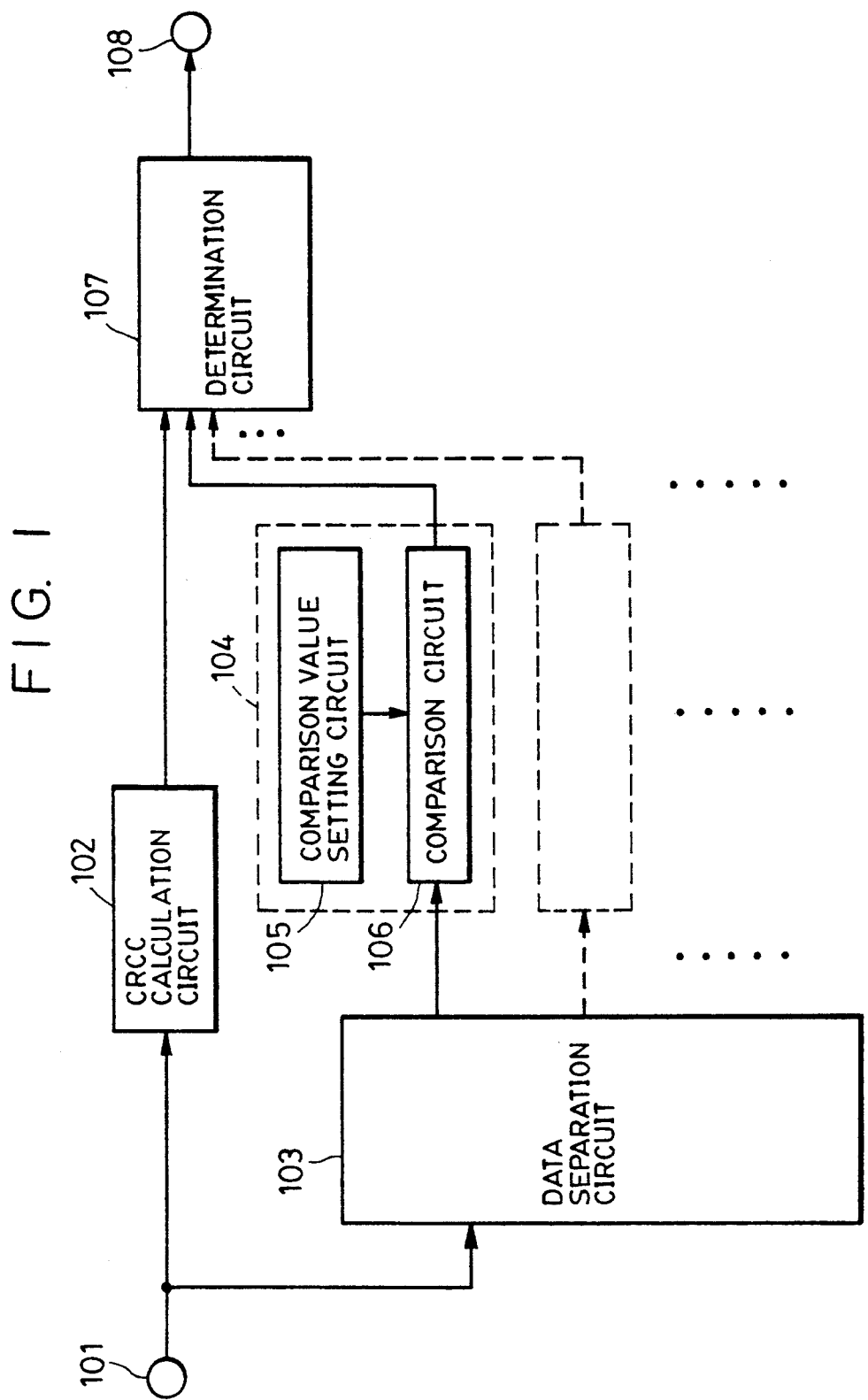
FIG. 1 is a drawing showing the schematic configuration of an information signal processing apparatus according to an embodiment of the present invention.

FIG. 1 is a diagram showing the schematic configuration of an information signal processing apparatus according to an embodiment of the present invention.

In FIG. 1, information data to which check data used as a CRCC have been added are supplied to input terminal 101 via a transmission channel (not shown). The information data input to the input terminal 101 is supplied to a CRCC calculation circuit 102, which detects whether or not an error is present in the information data by a well-known method using the check data added to the information data, and outputs the result of detection to a determination circuit 107.

In a conventional apparatus, error detection in data has been performed utilizing only the result of detection by the CRCC calculation circuit 102. In the FIG. 1 apparatus according to the embodiment of the present invention, however, by performing error detection in data by the following method in addition to the result of detection by the CRCC calculation circuit 102, the data error detection capability of the apparatus is increased.

That is, the information data input to the input terminal 101 is also supplied to a data separation circuit 103, which separates data coinciding with the above-described unused data or pseudo-fixed data from the input information data and supplies the separated data to a comparison circuit 106.

On the other hand, data corresponding to the unused data or pseudo-fixed data are supplied from a comparison value setting circuit 105 to the comparison circuit 106, which compares whether or not the unused data or pseudo-fixed data separated by the data separation circuit 103 coincide with the data supplied from the comparison value setting circuit 105, and supplies the result of comparison to the above-described determination circuit 107.

The configuration comprises the comparison circuit 106 and the comparison value setting circuit 105 will now be termed a data determination circuit 104. When plural kinds of unused data or pseudo-fixed data have been set in the information data supplied to the input terminal 101, it is necessary to provide data determination circuits 104 the number of which equals the number of the kinds.

If the result of detection that no error is present in the data has been obtained from the CRCC calculation circuit 102, and the result of detection that the unused data or pseudo-fixed data separated by the data separation circuit 103 coincide with the data supplied from the comparison value setting circuit 105 has been obtained from the data determination circuit 104, the determination circuit 107 determines that no error is generated in the formation data supplied to the input terminal 101, and outputs a signal indicating the result of determination from output terminal 108.

As described above, while the probability of not detecting data errors for the generation of a burst error longer than the bit length (m bits) of check data is about $\frac{1}{2}$ xm in the error detection method which uses only the CRCC, it is possible to increase the detection rate of a data error according to the method using the configuration as shown in FIG. 1.

Figure 2:
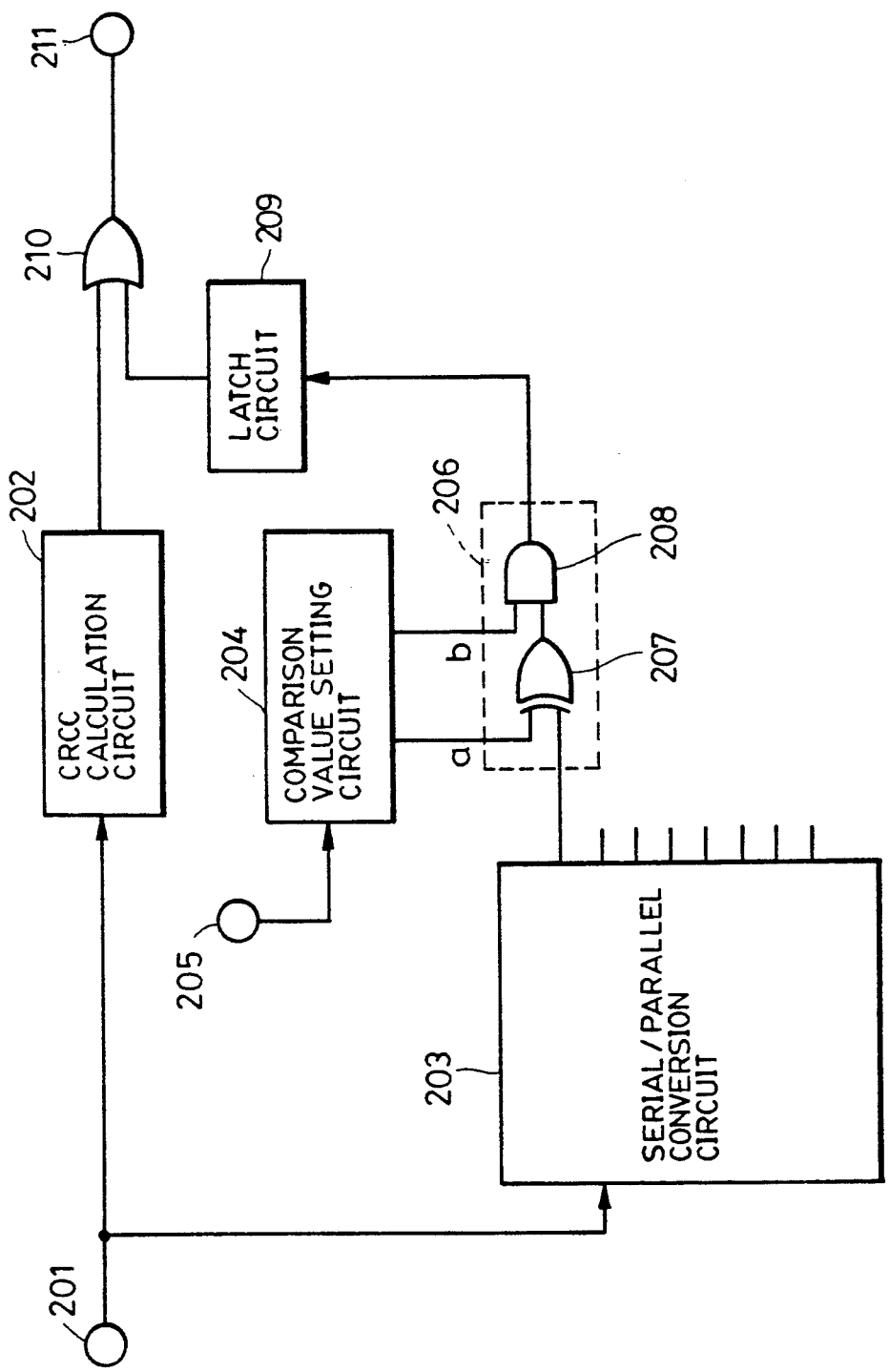
FIG. 2 is a diagram showing the schematic configuration of an information signal processing apparatus according to another embodiment of the present invention.
Figure 3:
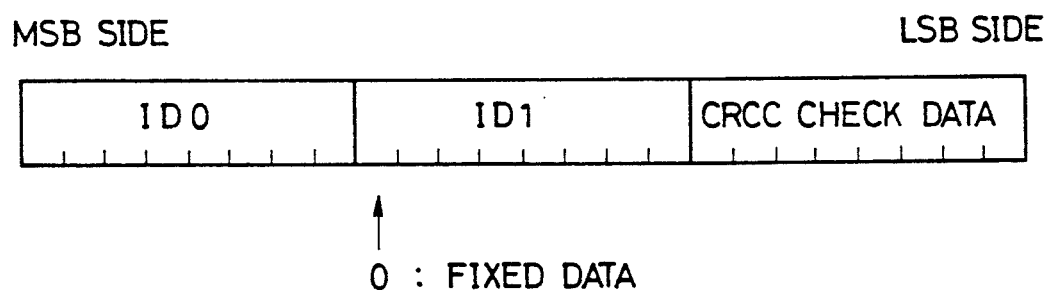
FIG. 3 is a diagram showing an example of the configuration of information data.

An explanation will now be provided of another embodiment of the present invention with reference to FIGS. 2 and 3.

FIG. 2 is a diagram showing the schematic configuration of an information signal processing apparatus according to the other embodiment of the present invention.

The information signal processing apparatus shown in FIG. 2 detects the generation of a data error in information data as shown in FIG. 3.

FIG. 3 is a diagram showing an example of the configuration of information data used in the present embodiment. The information data shown in FIG. 3 comprise ID data ($ID_0$ and $ID_1$) in a unit of two symbols (one symbol comprises 8 bits) and CRCC check data in a unit of one symbol. The most significant bit (at the MSB side) in the $ID_1$ of the ID data is unused data which is fixed data indicating "0".

In FIG. 2, the information data as shown in FIG. 3 are serially supplied from the MSB side shown in FIG. 3 to input terminal 201 via a transmission channel (not shown). The information data input to the input terminal 201 are supplied to the CRCC calculation circuit 202, which detects whether or not an error is present in the information data according to a well-known method using the CRCC check data added to the information data. The CRCC calculation circuit 202 outputs a "1" signal (a high level) if an error has been detected in the information data, and outputs a "0" signal (a low level) if no error has been detected in the information data.

The information data input to the input terminal 201 are supplied also to a serial/parallel conversion circuit 203, which converts the serially supplied information data into 8-bit parallel data and outputs the converted data. The $ID_0$ data, the $ID_1$ data, and the CRCC check data are sequentially output as 8-bit parallel data from the serial/parallel conversion circuit 203.

The most-significant-bit data in the 8-bit parallel data output from the serial/parallel conversion circuit 203 as described above is supplied to a comparison circuit 206.

In FIG. 2, a control signal for setting a comparison value has been input from a system controller (not shown) to input terminal 205. A comparison value setting circuit 204 outputs comparison value data "a" indicating "0" if fixed data "0" has been set to the most significant bit in the $ID_1$ data as shown in FIG. 3, and outputs comparison value data "a" indicating "1" to an exclusive OR gate 207 within the comparison circuit 206 if fixed data "1" has been set to the most significant bit in the $ID_1$ data.

In accordance with the control signal input to the input terminal 205, the comparison value setting circuit 204 outputs an effective-data indicating signal "b" indicating "1" only while the $ID_1$ data are output from the serial/parallel conversion circuit 203, and outputs an effective-data indicating signal "b" indicating "0" while the $ID_0$ data or the CRCC check data are output from the parallel/serial conversion circuit 203, to an AND gate 208 within the comparison circuit 206.

Accordingly, the exclusive OR gate 207 within the comparison circuit 206 outputs a signal indicating "0" when the most-significant-bit data output from the serial/parallel conversion circuit 203 coincides with the comparison data "a" output from the comparison value setting circuit 204 (that is, when no error is generated in the data), and outputs a signal indicating "1" when the two data do not coincide (that is, when an error is generated in the data), and supplies the signal to the AND gate 208 in the following stage.

An effective-data indicating signal "b" has been supplied from the comparison value setting circuit 204 to the AND gate 208 within the comparison circuit 206. The AND gate 208 outputs a signal indicating the result of comparison between the most-significant-bit data in the $ID_1$ data output from the exclusive OR gate 207 and the comparison value data to a latch circuit 209 in the following stage only while the effective-data indicating signal "b" output from the comparison value setting circuit 204 indicates "1", that is, while the $ID_1$ data are output from serial/parallel conversion circuit 203.

As described above, the comparison circuit 206 outputs a signal indicating "1" only when an error is generated in the most-significant-bit data in the $ID_1$ data, and outputs a signal indicating "0" for all other cases.

The signal output from the comparison circuit 206 is latched by the latch circuit 209 in order to adjust its timing with a signal output from the CRCC calculation circuit 202, and is supplied to an OR gate 210 together with the signal output from the CRCC calculation circuit 202.

The OR gate 210 outputs a signal indicating "0" only when the both signals output from the CRCC calculation circuit 202 and the comparison circuit 206 are signals indicating "0", that is, only when both the data error detection method by the CRCC and the data error detection method using unused data detect that no error is generated in the data, and outputs a signal indicating "1", which indicates that an error is generated in the data, for other cases.

As described above, in the embodiment shown in FIGS. 2 and 3, since the CRCC check data comprise 8 bits, a generated error cannot be detected with the probability of $\frac{1}{2}^8 = 1/256$ in the CRCC error detection method if a burst error longer than 8 bits is generated. However, by also using the error detection method using unused data, the probability of not detecting data error is less than half of that for the conventional method, and it is therefore possible to greatly increase the error detection capability. An increase in the amount of hardware in this case is very small, as shown in FIG. 2.

In the foregoing embodiment shown in FIGS. 2 and 3, an explanation has been provided only for the case wherein the most significant bit in the $ID_1$ data is unused data. If a plurality of unused data are present, a comparison circuit 206 and a comparison value setting circuit 204 may be provided for each bit data of 8-bit parallel data output from the serial/parallel conversion circuit 203 shown in FIG. 2, and each comparison value setting circuit 204 may output a comparison-value data "a" and an effective-data indicating signal "b" in accordance with a control signal input to input terminal 205. Data error detection may be performed by making only the result of comparison by the comparison circuit 206 effective for information data wherein unused data are present.

In the embodiment shown in FIGS. 2 and 3, if the ID data are, for example, ID data corresponding to image information, information relative to a field number, a line number and the like may be considered as the ID data. In this case, ID data indicating a field number have a longer period for the change of the contents of data than ID data indicating a line number, and therefore can be considered as the above-described pseudo-fixed data. Hence, by controlling the comparison value setting circuit 204 by a control signal supplied from the input terminal 205 so that the comparison value setting circuit 204 outputs comparison-value data corresponding to the pseudo-fixed data, it is possible to increase the data error detection capability even if no unused data are present unlike the information data shown in FIG. 3.

As explained above, according to the present invention, it is possible to provide an information signal processing method having a higher data error detection capability than a conventional method.

What is claimed is:

1. An information signal processing method comprising the steps of:
   (A) receiving an information signal to which an error detecting code has been added and a part of which other than said error detecting code has been set to a code indicating a predetermined value;
   (B) detecting an error in the received information signal according to the error detecting code added to the information signal; and
   (C) detecting an error in the received information signal by detecting whether or not the part set to the predetermined value has changed.

2. An information signal processing method according to claim 1, wherein said code indicating the predetermined value is a code indicating an identical value for a predetermined time period.

3. An information signal processing method according to claim 1, wherein said code indicating the predetermined value is a code which is not used as information data.

4. An information signal processing method according to claim 1, wherein said code indicating the predetermined value is significant address data within address data.

5. An information signal processing method according to claim 1, wherein said error detecting code is a cyclic redundancy check code.

6. An information signal processing method according to claim 1, wherein said step of detecting an error in the received information signal by detecting whether or not the part set to a predetermined value has changed includes:
   (a) comparing whether or not said part of the information signal set to the predetermined value coincides with a present value; and
   (b) determining that no error is present in said received information signal if said part of the information signal coincides with the preset value, and determining that an error is present if the two values do not coincide with each other, according to a result of the comparison.

7. An information signal processing method comprising the steps of:
   (A) receiving an information signal to which an error detecting code and a code indicating an identical value for at least a predetermined period have been added;
   (B) detecting an error in the received information signal according to the error detecting code added to the information signal; and
   (C) detecting an error in the information signal by detecting whether or not the code indicating the identical value for at least the predetermined period has changed.

8. An information signal processing method according to claim 7, wherein said code indicating the identical value for the predetermined period is a code indicating a predetermined value for the predetermined period.

9. An information signal processing method according to claim 7, wherein said code indicating the identical value for at least the predetermined time period is a code which is not used as information data.

10. An information signal processing method according to claim 7, wherein said code indicating the identical value for at least the predetermined period is significant address data within address data.

11. An information signal processing method according to claim 7, wherein said error detecting code is a cyclic redundancy check code.

12. An information signal processing method according to claim 7, wherein said step of detecting an error in the received information by detecting whether or not the code indicating the identical value for at least the predetermined time has changed includes:
 (a) comparing whether or not said code indicating the identical value for at least the predetermined period coincides with a preset value; and
 (b) determining that no error is present in said received information signal if said code indicating the identical value for at least the predetermined period coincides with the preset value, and determining that an error is present if the two values do not coincides, according to a result of the comparison.

13. An information signal processing apparatus comprising:
 (A) reception means for receiving an information signal to which an error detecting code has been added and a part of which other than said error detecting code has been set to a code indicating a predetermined value;
 (B) first error detection means for detecting an error in the received information signal according to the error detecting code added to the information signal; and
 (C) second error detection means for detecting an error in the received information signal by detecting whether or not said part of the information signal set to the predetermined value has changed.

14. An information signal processing apparatus according to claim 13, wherein said code indicating the predetermined value is a code indicating an identical value for a predetermined time period.

15. An information signal processing apparatus according to claim 13, wherein said code indicating the predetermined value is a code which is not used as information data.

16. An information signal processing apparatus according to claim 13, wherein said code indicating the predetermined value is significant address data within address data.

17. An information signal processing apparatus according to claim 13, wherein said error detecting code is a cyclic redundancy check code.

18. An information signal processing apparatus according to claim 13, wherein said second error detection means includes:
 (a) comparison means for comparing whether or not said part of the information signal set to the predetermined value coincides with a preset value; and
 (b) determination means for determining that no error is present in said information signal if said part of the information signal coincides with the preset value, and for determining that an error is present if the two values do not coincide, according to a result of the comparison by said comparison means.

19. An information signal processing apparatus according to claim 13, wherein said second error detection means includes:
 (a) separation means for separating said code set to the predetermined value from said received information signal;
 (b) comparison means for comparing whether or not the code separated by said separation means coincides with a preset value; and
 (c) determination means for deterimining that no error is present in said received information signal if said code set to the predetermined value coincides with the preset value, and for determining that an error is present if the two values do not coincide, according to a result of the comparison by said comparison means.

20. An information signal processing apparatus according to claim 13, wherein said second error detection means includes:
 (a) conversion means for serially inputting said information signal for every code having a predetermined number of bits and converting every code into parallel data; and
 (b) comparison means for comparing whether or not data at a predetermined bit position within the parallel data formed by said conversion means coincides with a preset value; and
 (c) determination means for determining that no error is present in said information signal if the value of said data at the predetermined bit position coincides with the preset value, and for determining that an error is present if the two values do not coincide.

21. An information signal processing apparatus comprising:
 (A) reception means for receiving an information signal to which an error detecting code and a code indicating an identical value for at least a predetermined period have been added;
 (B) first error detection means for detecting an error in the received information signal according to the error detecting code added to the information signal; and
 (C) second error detection means for detecting an error in the received information signal by detecting whether or not said code indicating the identical value for at least the predetermined period has changed.

22. An information signal processing apparatus according to claim 21, wherein said code indicating the identical value for the predetermined period is a code indicating a predetermined value for the predetermined period.

23. An information signal processing apparatus according to claim 21, wherein said code indicating the identical value for at least the predetermined time period is a code which is not used as information data.

24. An information signal processing apparatus according to claim 21, wherein said code indicating the identical value for at least the predetermined period is significant address data within address data.

25. An information signal processing apparatus according to claim 21, wherein said error detecting code is a cyclic redundancy check code.

26. An information signal processing apparatus according to claim 21, wherein said second error detection means includes:
 (a) comparison means for comparing whether or not said code indicating the identical value for at least the predetermined period coincides with a preset value; and (b) determination means for determining that no error is present in said received information signal if said code indicating the identical value for at least the predetermined period coincides with the preset value, and for determining that an error is present if the two values do not coincide, according to a result of the comparison by said comparison means.

27. An information signal processing apparatus according to claim 21, wherein said second error detection means includes:
   (a) separation means for separating said code indicating the identical value for at least the predetermined period from said received information signal;
   (b) comparison means for comparing whether or not the code separated by said separation means coincides with a preset value; and
   (c) determination means for determining that no error is present in said received information signal if said code indicating the identical value for at least the predetermined period coincides with the preset value, and for determining that an error is present if the two values do not coincide with each other, according to a result of the comparison by said comparison means.

28. An information signal processing apparatus according to claim 21, wherein said second error detection means includes:
   (a) conversion means for serially inputting said information signal for every code having a predetermined number of bits and for converting every code into parallel data; and
   (b) comparison means for comparing whether or not data at a predetermined bit position within the parallel data formed by said conversion means coincides with a preset value; and
   (c) determination means for determining that no error is present in said information signal if the value of said data at the predetermined bit position coincides with the preset value, and for determining that an error is present if the two values do not coincide, according to a result of the comparison by said comparison means.

* * * * *

UNITED STATES PATENT AND TRADEMARK OFFICE
CERTIFICATE OF CORRECTION

PATENT NO. : 5,303,245
DATED : April 12, 1994
INVENTOR(S) : AKIHIRO SHIKAKURA ET AL.

It is certified that error appears in the above-identified patent and that said Letters Patent is hereby corrected as shown below:

<u>COLUMN 1</u>

Line 21, "polynominal" should read --polynomial--.

<u>COLUMN 7</u>

Line 23, "coincides," should read --coincide,--.

Signed and Sealed this

Twenty-fifth Day of October, 1994

Attest:

BRUCE LEHMAN

Attesting Officer　　　　Commissioner of Patents and Trademarks